(12) United States Patent
Lovisa

(10) Patent No.: US 6,944,198 B2
(45) Date of Patent: Sep. 13, 2005

(54) SEMICONDUCTOR OPTICAL COMPONENT

(75) Inventor: Stéphane Lovisa, Paris (FR)

(73) Assignee: Avanex Corporation, Fremont, CA (US)

(*) Notice: Subject to any disclaimer, the term of this patent is extended or adjusted under 35 U.S.C. 154(b) by 0 days.

(21) Appl. No.: 10/309,074

(22) Filed: Dec. 4, 2002

(65) Prior Publication Data
US 2003/0138014 A1 Jul. 24, 2003

(30) Foreign Application Priority Data
Dec. 6, 2001 (FR) .............................. 01 15775

(51) Int. Cl.$^7$ ................................. H01S 5/00
(52) U.S. Cl. ........................... 372/45; 372/46
(58) Field of Search ....................... 372/45–46

(56) References Cited

U.S. PATENT DOCUMENTS

| 4,901,326 | A | * | 2/1990 | Hayakawa et al. | ............ 372/45 |
| 5,210,767 | A | * | 5/1993 | Arimoto et al. | ............ 372/46 |
| 5,537,433 | A | * | 7/1996 | Watanabe | ............ 372/45 |
| 5,608,752 | A | * | 3/1997 | Goto et al. | ............ 372/46 |
| 5,920,586 | A | | 7/1999 | Nagai | |
| 6,175,582 | B1 | * | 1/2001 | Naito et al. | ............ 372/45 |
| 6,285,694 | B1 | | 9/2001 | Shigihara | |
| 6,650,671 | B1 | * | 11/2003 | Garbuzov et al. | ............ 372/45 |

OTHER PUBLICATIONS

Inoguchi K et al: "Operation of 780 NM ALGAAS Distributed Feedback Lasers at 100 DEG C with Low–Loss Waveguide Structure" Japanese Journal of Applied Physics, Publication Office Japanese Journal of Applied Physics. Tokyo, JP, vol. 33, No. 1B, Part 1, 1994, pp. 852–855, XP000596434, Jan. 1994.

Lelong I O et al: "A pulsed High–Power Quantum Well Laser Using an Asymmetric Waveguide" Semiconductor Science and Technology, Institute of Physics. London, GB, vol. 11, No. 4, Apr. 1, 1996, pp. 568–570, XP000586930.

* cited by examiner

Primary Examiner—MinSun Harvey
Assistant Examiner—James Menefee
(74) Attorney, Agent, or Firm—Moser, Patterson & Sheridan LLP

(57) ABSTRACT

The laser type semiconductor optical component comprises: a semiconductor material substrate, a bottom cladding layer containing n-type carriers, an active layer forming one of more quantum wells, and a top cladding layer containing p-type carriers. To increase the emission power of the laser without increasing the vertical divergence of the beam, the bottom cladding layer has a higher refractive index than the top cladding layer. The lasers for pumping optical fiber amplifiers.

16 Claims, 1 Drawing Sheet

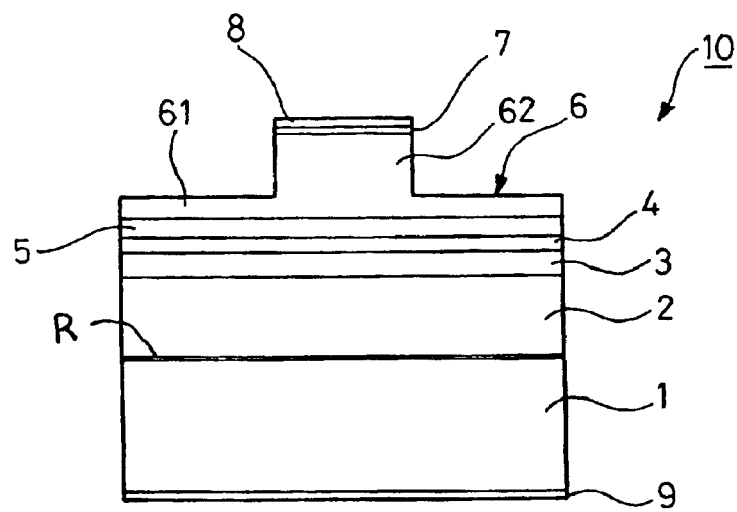
FIG_1
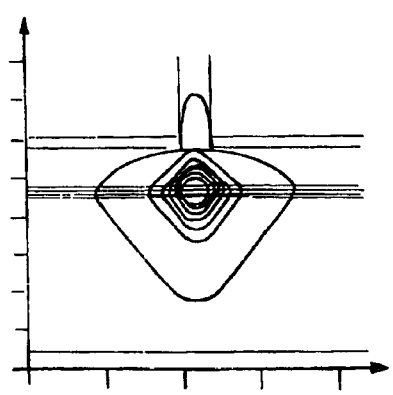
FIG_2
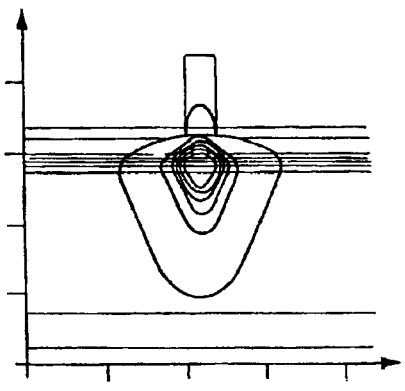
FIG_3

SEMICONDUCTOR OPTICAL COMPONENT

CROSS REFERENCE TO RELATED APPLICATIONS

This application claims benefit of French Application No. 01 15 775, filed on Dec. 6, 2001, and is herein incorporated by reference in its entirety.

BACKGROUND OF THE INVENTION

1. Field of the Invention

The present invention relates to a semiconductor optical component comprising a stack of layers, and more particularly it relates to a semiconductor laser.

2. Description of the Related Art

A semiconductor laser can be used as a pumping source for amplifying optical signals transported over long distances by an optical fiber. This is known in the art.

A semiconductor laser is an optical component, generally including a stack of doped or undoped semiconductor layers, and in particular an active layer. When fed with current, the active layer emits radiation by electroluminescence. From above a threshold current, the radiation emitted by the active layer can be amplified and then constitutes laser radiation at wavelengths in a band situated around 980 nm in the case of some optical pumping lasers, for example. The laser, which is generally in the shape of a rectangular block, can have front and rear laser lateral faces cleaved to form faceted mirrors so that Fabry-Perot longitudinal propagation modes are established in the laser.

Throughout the remainder of the description, the term "layer" may refer either to a single layer or to a stack of layers with the same function.

To be more precise, this type of laser conventionally comprises an n-doped substrate based on gallium arsenide (GaAs) on which are successively deposited:

an n-doped AlGaAs bottom cladding layer, an InGaAsP bottom confinement layer, an InGaAsP active layer forming one or more quantum wells, an InGaAsP top confinement layer, a p-doped AlGaAs top cladding layer, and one or more contact layers, generally layers of GaAs, for making ohmic contacts, i.e. for correct flow of injected current to the active layer.

The confinement layers are also known as separate confinement heterostructures (SCH).

The active and confinement layers form the optically active area of the laser, which is also known as the light guide.

Researchers are currently seeking to increase the power coupled from a laser of the above kind into the interior of the optical fiber to which it is connected, for constant injected current.

For this purpose, it is known in the art to use a broad waveguide (BW) laser whose top and bottom confinement layers are much thicker than in conventional lasers. The thickness of the confinement layers in a BW laser is typically of the order of 600 nm, as against 100 nm for a conventional laser. This confines practically all (typically 99%) of the mode in the active layer, and thus increases the external efficiency of the laser.

However, increasing the thickness of the confinement layers significantly widens the light guide. This significantly increases the vertical divergence of the laser, because the mode is very "pinched" in the active layer, which causes high divergence at the output of the laser. Vertical divergence is the angle at the apex of the exit cone of the laser beam in a plane perpendicular to the plane of the semiconductor layers. It is typically of the order of 32°.

It is known in the art to place a device such as a lens at the output of the laser, before the fiber, which device is intended to narrow the laser beam in the vertical direction to solve this problem.

That solution is not satisfactory, however, and cannot be envisaged on an industrial scale, because the coupling ratio obtained is not reproducible.

SUMMARY OF THE INVENTION

An object of the present invention is therefore to develop a semiconductor laser type semiconductor optical component whose external efficiency is comparable to that of the most powerful lasers known at present and whose divergence is reduced compared to the prior art.

To this end the present invention proposes a semiconductor laser type semiconductor optical component comprising:

a semiconductor material substrate, a bottom cladding layer containing n-type carriers, an active layer forming one of more quantum wells, and a top cladding layer containing p-type carriers, which component is characterized in that said bottom cladding layer has a higher refractive index than said top cladding layer.

According to the invention, the inherent mode of light propagation in the component is made asymmetrical with respect to the quantum well by choosing a refractive index for the bottom cladding layer higher than that of the top cladding layer. The basic idea of the invention is firstly to be able to spread the mode vertically so that it is less "pinched" and thus less divergent. However, simple spreading in a conventional structure would not be effective, because the mode would cover too much of the areas containing the n-type and p-type carriers, which create additional losses by absorbing light. The p-type carriers are more absorbent than the n-type carriers. The idea is therefore to "attract" the mode toward the cladding layer containing the n-type carriers in order to move it away from that containing the p-type carriers. This is achieved by choosing for the bottom cladding layer a refractive index higher than that of the top cladding layer.

The invention reduces vertical divergence. Vertical divergences of the order of 23° are obtained, as against 32° in the prior art. This significantly increases the reproducibility of the coupling by means of a lens between a component of the invention and an optical fiber. In 95% of cases a coupling ratio exceeding 65% can typically be obtained, whereas with the prior art component a coupling ratio exceeding 55% is obtained in only 50% to 80% of cases.

The index difference between the bottom cladding layer and the top cladding layer is advantageously at least 0.01.

When the bottom and top cladding layers are made from an alloy based on AlGaAs, the index difference is advantageously obtained by choosing a molar concentration of aluminum in the bottom cladding layer lower than the molar concentration of aluminum in the top cladding layer.

In a preferred embodiment, the difference between the above molar concentrations is at least 2%.

In another advantageous embodiment, the difference is at least 5%, and a reflective layer is disposed between the substrate and the bottom cladding layer. The reflective layer is needed because the index difference between the substrate and the bottom cladding layer is very high and the mode is "sucked up" by the even higher index substrate (whose index is of the order of 3.52). The low index layer is therefore inserted to isolate the light guide optically from the substrate.

A molar concentration of aluminum of 45% in the top cladding layer and of 38% in the bottom cladding layer can be chosen, for example.

If the optical component further includes a bottom confinement layer between the bottom cladding layer and the active layer and a top confinement layer between the active layer and the top cladding layer, the thickness of the two confinement layers is preferably greater than 140 nm.

This modifies the configuration of the confinement area to compensate the spreading of the mode by increasing its confinement, which preserves sufficient internal efficiency of the component. The overlap between the quantum well and the mode thus remains substantially the same.

The optical component of the invention therefore has internal efficiency equivalent to that of prior components and external efficiency which is significantly improved because of its reduced vertical divergence.

The invention also provides a laser including an optical component as defined hereinabove.

Other features and advantages of the present invention become apparent in the following description of one embodiment of the invention, which description is given by way of illustrative and non-limiting example.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1 shows very diagrammatically in section a semiconductor laser of the invention, FIG. 2 shows the profile of an inherent mode of a prior art symmetrical index profile laser, and FIG. 3 shows the profile of an inherent mode of an asymmetrical index profile laser according to the invention.

Common elements retain the same reference number in all the figures.

FIG. 1 shows highly diagrammatically a cross section through a semiconductor ridge laser 10 in accordance with the invention.

DETAILED DESCRIPTION OF THE PREFERRED EMBODIMENT

The laser 10 comprises a gallium arsenide (GaAs) substrate 1 containing n-type carriers and on which are successively deposited, for example by metal organic vapor phase epitaxy (MOVPE):

a bottom cladding layer 2 of $Al_{0.38}Ga_{0.65}As$ alloy containing n-type carriers, having a refractive index of 3.317 and approximately 2 μm thick, a bottom confinement layer 3 of $Al_xGa_{1-x}As$, for example, having a continuously varying refractive index and approximately 0.14 μm thick, an active layer 4 forming a quantum well, for example of $In_xGa_{1-x}As$, having a refractive index of 3.6 and approximately 0.007 μm thick, a top confinement layer 5 of $Al_{0.45}Ga_{1-x}As$, for example, having a continuously varying refractive index and approximately 0.14 μm thick, a top cladding layer 6 of $Al_{0.45}Ga_{0.55}As$ alloy containing p-type carriers, having a refractive index of 3.28 and approximately 1.7 μm thick, a contact layer 7, and an electrode layer 8 containing p-type carriers.

An electrode layer 9 containing n-type carriers is deposited on the face of the substrate 1 opposite that on which the layers 2 to 8 are deposited. The electrode layers 8 and 9 are connected to a supply of current (not shown).

In a manner that is known in the art, the top cladding layer 6 comprises two areas:

firstly, an area 61 in contact with the top confinement layer 5 and occupying the whole of the width of the laser 10, and secondly, an area 62 on top of the area 61 and obtained by etching away a portion of the material of the layer 6, except over a central area narrower than that of the laser 10; it is this area 62 that is referred to as the ridge.

The chosen alloys constituting the active layer 4 and the confinement layers 3 and 5 and their chosen thickness are given for information only.

In accordance with the invention, the alloys forming the bottom cladding layer 2 and the top cladding layer 6 have different concentrations of aluminum (45 mol % for the layer 6 and 38 mol % for the layer 2), with the result that the refractive index of the layer 2 is higher than that of the layer 6.

FIG. 2 shows the profile of an inherent mode of a prior art symmetrical index profile laser and FIG. 3 shows that of an asymmetrical laser according to the invention. The plane of these figures corresponds to the cross section of the lasers and is identical to that of FIG. 1.

Comparison of these two figures shows that the mode is shifted downwards and that its vertical divergence is significantly reduced.

In addition to the advantage of the invention already referred to, namely the asymmetry of the inherent mode, which reduces vertical divergence, the invention also achieves the following advantages.

If the molar concentration of aluminum in the AlGaAs is less than 40%, the mobility of electrons in the alloy is strongly increased. This reduces the series resistance of the bottom cladding layer 2.

Also, because the inherent mode is "shifted" downwards in the laser 10 of the invention, compared to the prior art, it is preferable to reduce the thickness of the area 61 relative to the prior art (typically from 475 nm to approximately 200 nm). Because of this, when injecting current, the gain area is much narrower, and of substantially the same width as the optical mode, whereas in the prior art the gain area is approximately twice the width of the optical mode. Because of this improved match between the gain area and the optical mode, the electrical efficiency of the laser of the invention is improved, and the threshold current can therefore be halved (to 8 mA as against 16 mA in the prior art).

In one specific embodiment of the invention, if the concentration of aluminum in the bottom cladding layer is below 40%, it is preferable to provide a reflective layer (R)

between the substrate 1 and the bottom cladding layer 2, in particular a layer of AlGaAs, for example, approximately 0.2 μm thick. The reflective layer has a refractive index of 3.22, for example. The reflective layer optically isolates from the substrate the epitaxial layers carrying the optical mode. This is necessary because the refractive index of the substrate is very high (3.52), enabling it to "pump" the optical mode. Inserting a low index layer to prevent this amounts to "moving away" the substrate.

Of course, the present invention is not limited to the embodiment just described.

In particular, the composition, thickness and refractive index values given are offered by way of example and can be adapted as a function of the application without departing from the scope of the present invention.

Finally, any means can be replaced by equivalent means without departing from the scope of the invention.

While the foregoing is directed to embodiments of the present invention, other and further embodiments of the invention may be devised without departing from the basic scope thereof, and the scope thereof is determined by the claims that follow.

What is claimed is:

1. An edge-emitting semiconductor laser type semiconductor optical component comprising:
    a semiconductor material substrate,
    a bottom cladding layer containing n-type carriers,
    an active layer forming one of more quantum wells,
    a bottom confinement layer disposed between the active layer and the bottom cladding layer, wherein the bottom confinement layer has a thickness of approximately 140 nm;
    a top cladding layer containing p-type carriers, which component is characterized in that said bottom cladding layer has a higher refractive index than said top cladding layer, wherein the difference between the refractive index of said bottom cladding layer and that of said top cladding layer is at least 0.01,
    a top confinement layer disposed between the active layer and the top cladding layer, wherein the top confinement layer has a thickness of approximately 140 nm; and
    a reflective layer disposed between said substrate and said bottom cladding layer, wherein an output of the semiconductor optical component is along an edge thereof.

2. The component according to claim 1, characterized in that said bottom cladding layer and said top cladding layer are layers of an alloy based on AlGaAs.

3. The component according to claim 2, characterized in that the molar concentration of aluminum in said bottom cladding layer is less than the molar concentration of aluminum in said top cladding layer.

4. The component according to claim 3, characterized in that the difference between said molar concentrations is at least 2%.

5. The component according to claim 4, characterized in that said difference between said molar concentrations is at least 5%.

6. The component according to claim 5, characterized in that the molar concentration of aluminum is 45% in said top cladding layer and 38% in said bottom cladding layer.

7. The component according to claim 1, characterized in that it includes a ridge area.

8. A semiconductor laser type semiconductor optical component, comprising:
    a semiconductor material substrate;
    a bottom cladding layer of $Al_{0.383}Ga_{0.62}As$ alloy containing n-type carriers;
    a reflective layer disposed between the substrate and the bottom cladding layer;
    an active layer forming one of more quantum wells;
    a bottom confinement layer disposed between the active layer and the bottom cladding layer, wherein the bottom confinement layer has a thickness of approximately 140 nm;
    a top cladding layer containing p-type carriers, wherein the bottom cladding layer has a higher refractive index than the top cladding layer; and
    a top confinement layer disposed between the active layer and the top cladding layer, wherein the top confinement layer has a thickness of approximately 140 nm.

9. The component according to claim 8, wherein the top cladding layer is made from a $Al_{0.45}Ga_{0.55}As$ alloy.

10. The component according to claim 8, wherein the difference between the refractive index of the bottom cladding layer and that of the top cladding layer is at least 0.01.

11. The component according to claim 8, wherein the bottom cladding layer has a refractive index of 3.317.

12. A semiconductor laser type semiconductor optical component, comprising;
    a semiconductor material substrate;
    a bottom cladding layer containing n-type carriers;
    an active layer forming one of more quantum wells;
    a bottom confinement layer disposed between the active layer and the bottom cladding layer, wherein the bottom confinement layer has a thickness of approximately 140 nm;
    a top cladding layer containing p-type carriers, wherein the bottom cladding layer has a higher refractive index than the top cladding layer;
    a top confinement layer disposed between the active layer and the top cladding layer, wherein the top confinement layer has a thickness of approximately 140 nm; and
    a reflective layer disposed between the substrate and the bottom cladding layer.

13. The component according to claim 12, wherein the reflective layer has a refractive index of 3.22.

14. The component according to claim 12, wherein the reflective layer is configured to optically isolate a light guide from the substrate.

15. The component according to claim 12, wherein the top cladding layer is made from a $Al_{0.45}Ga_{0.55}As$ alloy.

16. The component according to claim 12, further including a ridge area disposed above the top confinement layer.

* * * * *